United States Patent
Ciaffi et al.

(10) Patent No.: US 7,921,311 B2
(45) Date of Patent: Apr. 5, 2011

(54) METHOD AND APPARATUS FOR MITIGATING CURRENT DRAIN IN A LOW-POWER HAND-HELD DEVICE

(75) Inventors: Marco Ciaffi, Sudbury, MA (US); Larnie Rabinowitz, Lexington, MA (US); Daniel Wilder, Derry, NH (US)

(73) Assignee: EMC Corporation, Hopkinton, MA (US)

( * ) Notice: Subject to any disclaimer, the term of this patent is extended or adjusted under 35 U.S.C. 154(b) by 751 days.

(21) Appl. No.: 11/862,783

(22) Filed: Sep. 27, 2007

(65) Prior Publication Data

US 2009/0089596 A1  Apr. 2, 2009

(51) Int. Cl.
*G06F 3/20* (2006.01)
*G06F 1/00* (2006.01)

(52) U.S. Cl. ........ 713/300; 327/108; 327/456; 327/538; 257/532; 361/93.9; 702/113

(58) Field of Classification Search ........... 713/300; 327/108, 456, 538; 257/532; 361/93.9; 702/113
See application file for complete search history.

(56) References Cited

U.S. PATENT DOCUMENTS

| | | | |
|---|---|---|---|
| 4,665,710 A * | 5/1987 | Kyzer et al. ............... 62/155 |
| 4,720,860 A | 1/1988 | Weiss | |
| 5,168,520 A | 12/1992 | Weiss | |
| 5,361,062 A | 11/1994 | Weiss et al. | |
| 6,600,238 B1 * | 7/2003 | Emberty et al. ............ 307/85 |
| 6,826,463 B2 * | 11/2004 | Nakamura ................ 701/29 |
| 7,712,341 B2 * | 5/2010 | Johansson et al. ...... 70/278.3 |
| 2003/0154008 A1 * | 8/2003 | Nakamura ............... 701/29 |
| 2008/0060393 A1 * | 3/2008 | Johansson et al. ........ 70/91 |

OTHER PUBLICATIONS

U.S. Appl. No. 11/766,301 filed in the name of M. Ciaffi et al. Jun. 21, 2007 and entitled "Reset-Tolerant Authentication Device".
U.S. Appl. No. 11/671,264 filed in the name of D.V. Bailey et al. Feb. 5, 2007 and entitled "Wireless Authentication Methods and Apparatus".
U.S. Appl. No. 11/530,655 filed in the name D.V. Bailey et al. Sep. 11, 2006 and entitled "Tokencode Exchanges for Peripheral Authentication".

* cited by examiner

*Primary Examiner* — Abdelmoniem Elamin
(74) *Attorney, Agent, or Firm* — Ryan, Mason & Lewis, LLP (57) ABSTRACT

An authentication device or other type of low-power hand-held device comprises a processor, an external button alternately configurable in an unpressed state and a pressed state, and current drain mitigation circuitry coupled to the external button and a corresponding input of the processor. The current drain mitigation circuitry is configured to connect the input of the processor to a first potential when the external button is in the unpressed state and to connect the input of the processor to a second potential different than the first potential when the external button is in the pressed state, thereby limiting current drain arising from the external button being stuck in the pressed state.

22 Claims, 4 Drawing Sheets

METHOD AND APPARATUS FOR MITIGATING CURRENT DRAIN IN A LOW-POWER HAND-HELD DEVICE

RELATED APPLICATION(S)

The present application is related to commonly-assigned U.S. patent application Ser. No. 11/766,301, filed Jun. 21, 2007 now pending, and entitled "Reset-Tolerant Authentication Device," the disclosure of which is incorporated by reference herein.

FIELD OF THE INVENTION

The present invention relates generally to user authentication tokens and other types of low-power hand-held devices, and more particularly to techniques for mitigating current drain in such devices.

BACKGROUND OF THE INVENTION

User authentication tokens are typically implemented as small, hand-held devices that display a series of passwords over time. These passwords, which may be one-time passwords, are more generally referred to herein as tokencodes. A user equipped with such an authentication token reads the currently displayed password and enters it into a computer or other element of an authentication system as part of an authentication operation. This type of dynamic password arrangement offers a significant security improvement over authentication based on a static password.

Conventional authentication tokens include both time-based tokens and event-based tokens. In a typical time-based token, the displayed passwords are based on a secret value and the time of day. A verifier with access to the secret value and a time of day clock can verify that a given presented password is valid. In a typical event-based token, the displayed passwords are based on a secret value and an event counter. The event counter may count the number of occurrences of a particular event, such as a user pressing a button on the token. A verifier with access to the secret value and the current event count can verify that a given presented password is valid.

It should be noted that a time-based authentication token may also be triggered to display a password in response to a designated event, such as a user pressing a button on the token. For example, a given time-based token may display a password only in response to a user pressing a button. In the absence of such a button press, no password is displayed. However, time-based authentication tokens need not be triggered in this manner. For example, a given time-based token may automatically display the current password without the need for a user to press a button.

Passwords can be communicated directly from the authentication token to a computer or other element of an authentication system, instead of being displayed to the user. For example, a wired connection such as a universal serial bus (USB) interface may be used for this purpose. Wireless authentication tokens are also known. In such tokens, the passwords are wirelessly communicated to a computer or other element of an authentication system. These wired or wireless arrangements save the user the trouble of reading the password from the display and manually entering it into the computer.

Additional details of exemplary conventional authentication tokens can be found in, for example, U.S. Pat. No. 4,720,860, entitled "Method and Apparatus for Positively Identifying an Individual," U.S. Pat. No. 5,168,520, entitled "Method and Apparatus for Personal Identification," and U.S. Pat. No. 5,361,062, entitled "Personal Security System," all of which are incorporated by reference herein.

It is generally desirable in authentication tokens and other types of low-power hand-held devices to minimize power consumption so as to conserve battery power. However, such devices are often carried in pockets or wallets and are thereby susceptible to having their buttons inadvertently pressed. For example, an event-based token may have its event button inadvertently stuck in a pressed state, thereby causing current to be drained from the battery. Although the amount of current drain associated with a given press of the event button is small, typically on the order of 30 microamps, the battery capacity in a small form factor device may be only about 10-20 milliamp-hours. Thus, a button being stuck in the pressed state could potentially drain the battery entirely in a matter of days. This drastically decreases the lifetime of the device and has a detrimental impact on the user experience. A similar problem arises for time-based tokens that are triggered based on events such as a user pressing a button on the token.

It is therefore apparent that a need exists for improved techniques for mitigating current drain in an authentication token or other type of low-power hand-held device, which avoid the problems associated with buttons being inadvertently stuck in a pressed state.

SUMMARY OF THE INVENTION

The present invention in one or more of the illustrative embodiments described herein meets the above-identified need by providing an authentication device or other type of device which includes current drain mitigation circuitry configured to limit an amount of current drain arising from a device button being stuck in a pressed state.

In accordance with one aspect of the invention, an authentication device or other type of low-power hand-held device comprises a processor, an external button alternately configurable in an unpressed state and a pressed state, and current drain mitigation circuitry coupled to the external button and a corresponding input of the processor. The current drain mitigation circuitry is configured to connect the input of the processor to a first potential when the external button is in the unpressed state and to connect the input of the processor to a second potential different than the first potential when the external button is in the pressed state, thereby limiting current drain arising from the external button being stuck in the pressed state.

In one illustrative embodiment, the current drain mitigation circuitry comprises a switch, a resistor and a capacitor, with the capacitor being coupled between the input of the processor and ground potential, and the switch being configured to connect the input of the processor to a supply voltage via the resistor when the external button is in the unpressed state, and to connect the input of the processor to ground potential when the external button is in the pressed state. The resistor in this embodiment is a pull-up resistor, and the capacitor is an isolation capacitor.

The input of the processor may comprise a general purpose input/output port capable of generating an interrupt. The general purpose input/output port of the processor may be configured such that the interrupt is generated when the external button transitions from the unpressed state to the pressed state. The processor responds to the interrupt by initiating an interrupt service routine and modifying stored state information to indicate that the external button was pressed. After modifying the stored state information, the processor clears a corresponding interrupt pending flag and sets a corresponding interrupt enable flag.

The illustrative embodiments advantageously overcome the above-noted drawbacks of conventional devices. For example, current drain is mitigated in situations in which a button is stuck in a pressed state, while ensuring correct processing of any future button presses after the button is no longer stuck in the pressed state. This can be accomplished without the need for excessive additional device components or firmware execution, and thus leads to reduced power consumption and longer battery life.

These and other features and advantages of the present invention will become more readily apparent from the accompanying drawings and the following detailed description.

DETAILED DESCRIPTION

The present invention will be described herein with reference to exemplary authentication devices and an associated authentication system. It is to be appreciated, however, that the invention is not restricted to use with the particular illustrative device and system configurations shown. For example, the disclosed techniques can be adapted in a straightforward manner for use with a wide variety of other types of low-power hand-held devices, including portable personal computers, mobile telephones, personal digital assistants (PDAs), wireless email devices, etc. More generally, the disclosed techniques are applicable to any device that is susceptible to having one or more of its external buttons inadvertently stuck in a pressed state.

The term "code" as used herein is intended to include authentication information such as one-time passwords or other tokencodes, or more generally any other information that a user may be required to submit for authentication purposes. Although the illustrative embodiments will be described below in the context of passwords, it is to be appreciated that the invention is more broadly applicable to any other type of authentication information.

Figure 1:
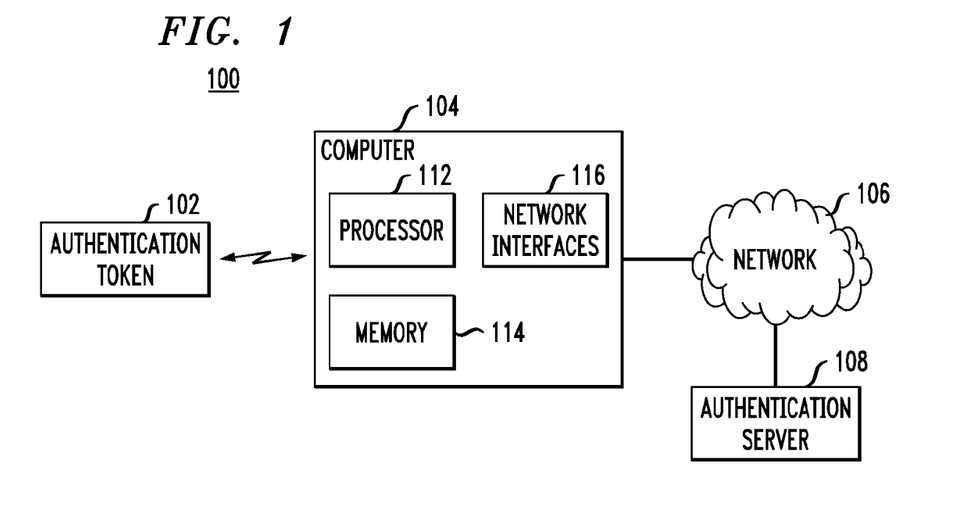
FIG. 1 is a simplified block diagram showing one example of an authentication system in an illustrative embodiment of the invention.

FIG. 1 shows an example of a network-based communication system 100 which includes an authentication token 102, a host device 104, a network 106 and an authentication server 108. The authentication token is configured to generate one-time passwords or other tokencodes in a conventional manner. Such passwords may be presented to a user via a display of the token, such that the user can manually enter a given password into a user interface of the host device 104. Alternatively, a given password may be communicated directly from the authentication token via a wired or wireless connection between that device and the host device. By way of example, the authentication token may be configured to communicate with the host device 104 via a wired connection such as a USB interface, or via a wireless connection such as a Bluetooth or IEEE 802.11 connection.

The authentication token 102 may comprise, for example, an event-based token. Alternatively, the token 102 may comprise a time-based token that is triggered by a designated event such as a button press, or a hybrid token that generates passwords using a combination of time-based and event-based techniques. As mentioned above, the disclosed techniques can also be adapted in a straightforward manner for use with other types of authentication devices, as well as a wide variety of other types of devices.

The host device 104 may comprise a desktop or portable personal computer, mobile telephone, PDA, wireless email device, workstation, kiosk, television set-top box, game console, or any other information processing device that supports authentication via passwords generated by an authentication token.

It should also be noted that a given authentication device need not take the form of a stand-alone hand-held token. For example, such a device may be incorporated into another processing device, such as a computer, mobile telephone, etc.

The network 106 may comprise, for example, a global computer network such as the Internet, a wide area network (WAN), a local area network (LAN), a satellite network, a telephone or cable network, or various portions or combinations of these and other types of networks.

A wide variety of conventional authentication processes may be implemented using an authentication token, host device and authentication server arranged as shown in FIG. 1. Such processes, being well known to those skilled in the art, will not be described in further detail herein. The present invention does not require the use of any particular type of authentication process.

It is to be appreciated that a given embodiment of the system 100 may include multiple instances of authentication token 102, host device 104, authentication server 108, and possibly other system components, although only single instances of such components are shown in the simplified system diagram for clarity of illustration.

Figure 2:
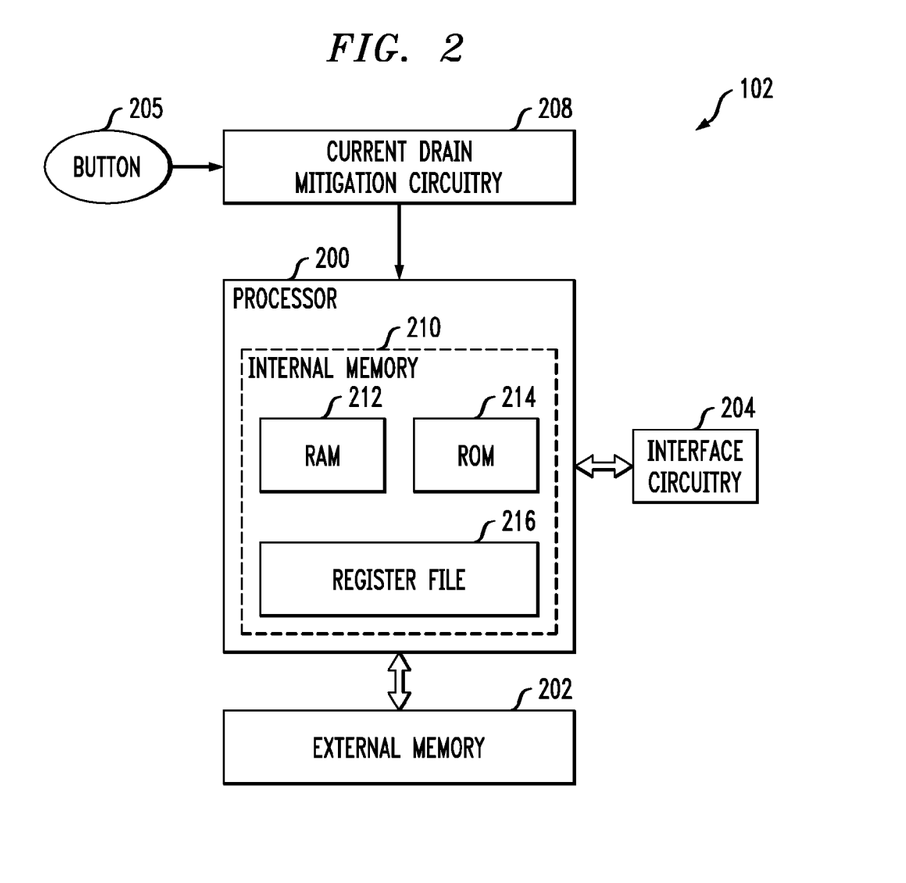
FIG. 2 shows a more detailed view of one possible implementation of an authentication device of the FIG. 1 system.

Referring now to FIG. 2, a more detailed illustrative implementation of authentication token 102 is shown. The authentication token in this embodiment comprises a processor 200 coupled to an external memory 202. The memory 202 is referred to as "external" in that it is external to the processor 200. It should be noted that the external memory is entirely optional. In other embodiments, the external memory 202 may be eliminated, with the token utilizing only memory that is internal to the processor 200.

Processor 200 is also coupled to interface circuitry 204 which may comprise, for example, circuitry for interfacing the authentication token 102 to the host device 104 via a wired or wireless connection, or circuitry for generating a visual or audible presentation of a given generated password. Thus, the interface circuitry may include, for example, wired or wireless interface circuitry such as USB, Bluetooth or 802.11 circuitry, or one or more speakers, displays and associated drivers, in any combination.

The authentication token 102 comprises a trigger button 205 which a user depresses each time the user requires generation of a new password. This is an example of an event trigger for an event-triggered authentication token, and such an event trigger is itself an example of what is more generally referred to herein as a trigger source. The trigger button is shown as being coupled via current drain mitigation circuitry 208 to the processor 200, although other arrangements are possible. More detailed examples of the current drain mitigation circuitry will be described below in conjunction with FIGS. 3A, 3B and 3C.

The trigger button 205 is a type of external button of the authentication token 102, and is alternately configurable in an unpressed state and a pressed state. As indicated above, when a user requires a new password from the token, the user presses the trigger button 205. It is possible under certain conditions for such a button to become inadvertently stuck in the pressed state, which can lead to excessive current drain and reduced battery life in the manner previously described herein.

One possible approach to addressing this problem involves providing firmware configured to disable an internal pull-up resistor of the device processor in order to minimize current drain when a corresponding button is stuck in the pressed state. Unfortunately, this approach can make it difficult to detect future button presses once the internal pull-up resistor has been disabled, and thus may not be well suited for use with event-based tokens or time-based tokens that are triggered by events such as button presses.

Another possible approach is to employ a timer to control the restarting of the processor after a predetermined period of time. In this approach, the device firmware re-enables the internal pull-up resistor responsive to expiration of the timer, checks the state of the button, and either re-enables the corresponding interrupt of the processor if the button has been released or disables the internal pull-up resistor if the button is still in the pressed state. The timer is then restarted and the process repeats. However, this approach can require significant additional device components as well as additional firmware execution, both of which tend to increase the amount of current drawn from the battery.

The illustrative embodiments of the invention do not apply the above-noted approaches, but instead overcome the stuck button problem at least in part by providing current mitigation circuitry 208 coupled to the button 205.

The term "external button" as used herein is intended to be construed broadly, so as to encompass any type of user-actuatable switch, key or other input mechanism that is controllable between an unpressed state and a pressed state. For example, a soft key of a touch-sensitive user interface screen may be viewed as another example of an external button as that term is used herein.

In this embodiment, the current drain mitigation circuitry 208 is coupled to the trigger button 205 and a corresponding input of the processor. Generally, the current drain mitigation circuitry is configured to connect the input of the processor to a first potential when the trigger button is in the unpressed state and to connect the input of the processor to a second potential lower than the first potential when the trigger button is in the pressed state, thereby limiting current drain arising from the trigger button being stuck in the pressed state. The term "potential" as used herein is intended to encompass, by way of example, positive or negative supply voltages or ground potential.

It should be noted that the authentication token 102 may also include power-up circuitry and associated processor functionality of a type described in the above-cited U.S. patent application Ser. No. 11/766,301, so as to make the token tolerant to inadvertent resets. For example, the token may be configured to distinguish resets generated by an event trigger or other legitimate trigger source of the token from inadvertent resets generated by undesirable interference or other external sources. This allows the processor to remain in its low-power sleep mode at the appropriate times, leading to reduced power consumption and longer battery life. It is to be appreciated, however, that such power-up circuitry and associated processor functionality is not a requirement of the present invention.

The processor 200 may be, for example, a microprocessor, a microcontroller, or another type of digital data processor. In this embodiment, the processor comprises internal memory 210, which more particularly comprises internal random access memory (RAM) 212, internal read-only memory (ROM) 214, and a register file 216. The register file may comprise, for example, control and status registers, special function registers, or other types of registers. Such a register file typically contains information about the current state of the processor and information used to control the operation of the processor. The processor will also generally include additional elements such as an instruction decoder, arithmetic logic units, and other elements typically found in a conventional processor, although such elements are not explicitly shown in the figure.

The various elements 200, 202 and 204 of FIG. 2 may be implemented in whole or in part as a conventional microprocessor, microcontroller, digital signal processor, application-specific integrated circuit (ASIC) or other type of circuitry, as well as portions or combinations of such circuitry elements. As will be appreciated by those skilled in the art, portions of a current drain mitigation process in accordance with an embodiment of the invention can be implemented at least in part in the form of one or more software programs that are stored at least in part in one or more of the memories 202, 210 and executed by processor 200. One or both of the memories 202, 210 may also be used for storing information used to perform password generation or other operations associated with an authentication process.

As a more particular example, the authentication device 102 may utilize a masked ROM approach in which one or more software programs for controlling operation of the device are stored in the internal ROM 214. In these and other implementations which execute software directly from internal memory 210, the external memory 202 may be eliminated.

Figure 3A:
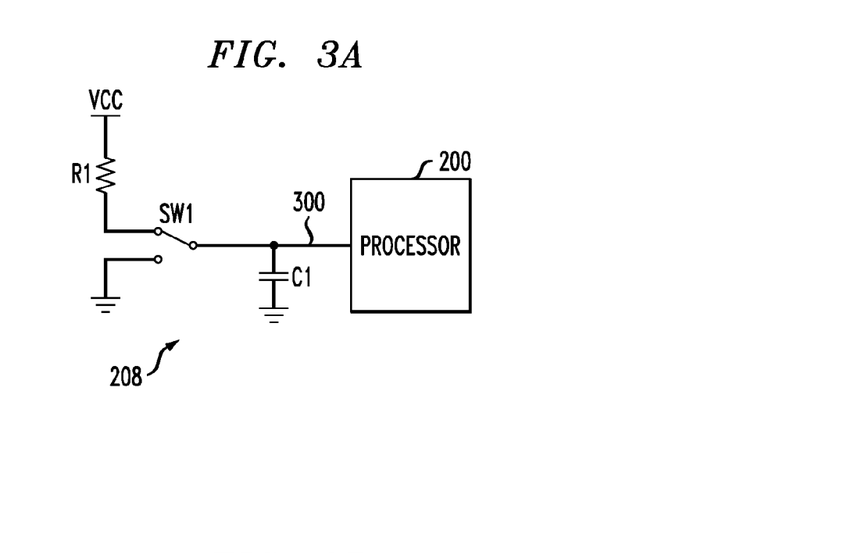
FIGS. 3A, 3B and 3C show examples of current drain mitigation circuitry in the FIG. 2 authentication device.

FIG. 3A shows one possible implementation of the current drain mitigation circuitry 208 of the authentication token 102. The processor 200 in this implementation has an input 300, which may comprise a general purpose input/output (I/O) port of the processor. The processor input may be, by way of example, any signal line, connection, pin, wire, trace or other type of input to which an external button may be coupled. A given processor may of course have multiple such inputs.

The current drain mitigation circuitry 208 as shown comprises a single-pole double-throw (SPDT) switch SW1, a resistor R1, and a capacitor C1. The resistor R1 is a pull-up resistor coupled between a first throw of the switch SW1 and a supply voltage VCC. The capacitor C1 serves as an isolation capacitor, and in this embodiment is coupled between the processor input 300 and ground potential. The second throw of the switch SW1 is coupled to ground potential, and the pole of the switch SW1 is coupled to the processor input 300. The switch is actuated by pressing the trigger button 205. More specifically, the switch is configured to connect the processor input 300 to the supply voltage VCC via resistor R1 when the trigger button 205 is in the unpressed state, and to connect the processor input to ground potential when the trigger button is in the pressed state.

In response to a given press of trigger button 205, the circuitry 208 of FIG. 3A is operative to disconnect the pull-up resistor R1 from processor input 300, and to connect the isolation capacitor C1 at the processor input 300 to ground potential. As will be described in conjunction with FIG. 4 below, this may trigger an interrupt to the processor 200.

Exemplary values for R1 and C1 in the FIG. 3A embodiment are 1 megaohm (Mohm) and 15000 picofarads (pF), respectively. The particular values selected in a given implementation will depend upon application-specific factors, as will be readily appreciated by those skilled in the art, and may typically range from about 100 ohm to 100 Mohm for R1, and from about 0.5 pF to 100 microfarads (μF) for C1. The supply voltage VCC may be, for example, 3 volts (V), although other values may be used, typically falling in the range between about 1.5 V to 5.5 V.

An advantage of this circuitry arrangement is that whenever the trigger button 205 is in the unpressed state, the pull-up resistor R1 will be connected and the processor will be able to respond to button presses. If the trigger button becomes stuck in the pressed state, the pull-up resistor R1 is automatically disconnected, and the isolation capacitor C1 is connected in its place. This in effect connects the processor input 300 to ground potential, thereby preventing current drain. When the button is subsequently released, the pull-up resistor R1 is again connected, the isolation capacitor C1 is disconnected, and the processor is ready to process the next button press.

Figure 3B:
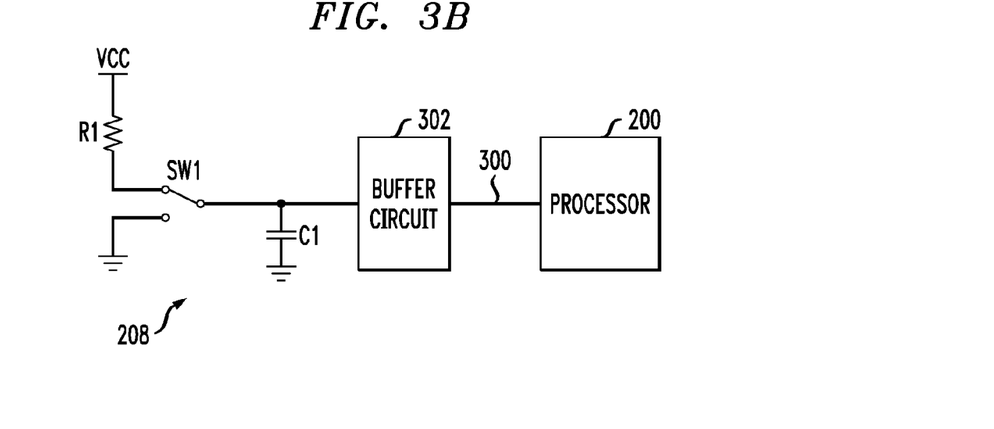
Figure 3C:
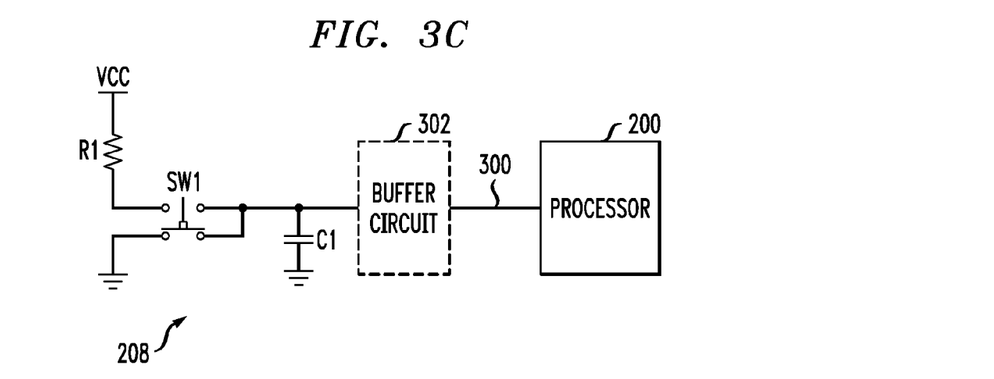

It is to be appreciated that the arrangement shown in FIG. 3A is merely an illustrative example, and numerous alternative circuitry arrangements may be used in implementing the invention. For example, other types of switches and alternative arrangements of circuit elements may be used, as will be apparent to those skilled in the art. FIG. 3B shows one possible alternative arrangement, in which current drain mitigation circuitry 208 further comprises a buffer circuit 302 arranged between the switch SW1 and input 300 of the processor 200. The buffer circuit 302 may comprise, for example, one or more transistor circuits, logic gates or buffer integrated circuits, as well as portions or combinations of such elements. FIG. 3C shows yet another alternative, in which switch SW1 is implemented as a double-pole single-throw (DPST) switch, rather than as an SPDT switch as in the embodiments of FIGS. 3A and 3B. This embodiment may be implemented with or without buffer circuit 302, which is therefore shown in dashed outline in the figure.

In other embodiments, the circuitry may be configured to operate with other types of circuit potentials. For example, the lower circuit potential could be a negative supply voltage rather than ground potential.

Also, the circuitry of FIGS. 3A, 3B and 3C is illustrated for the case of a single button and corresponding processor input. In other embodiments, multiple instances of such circuitry can be provided for use with respective multiple buttons of a given device.

Figure 4:
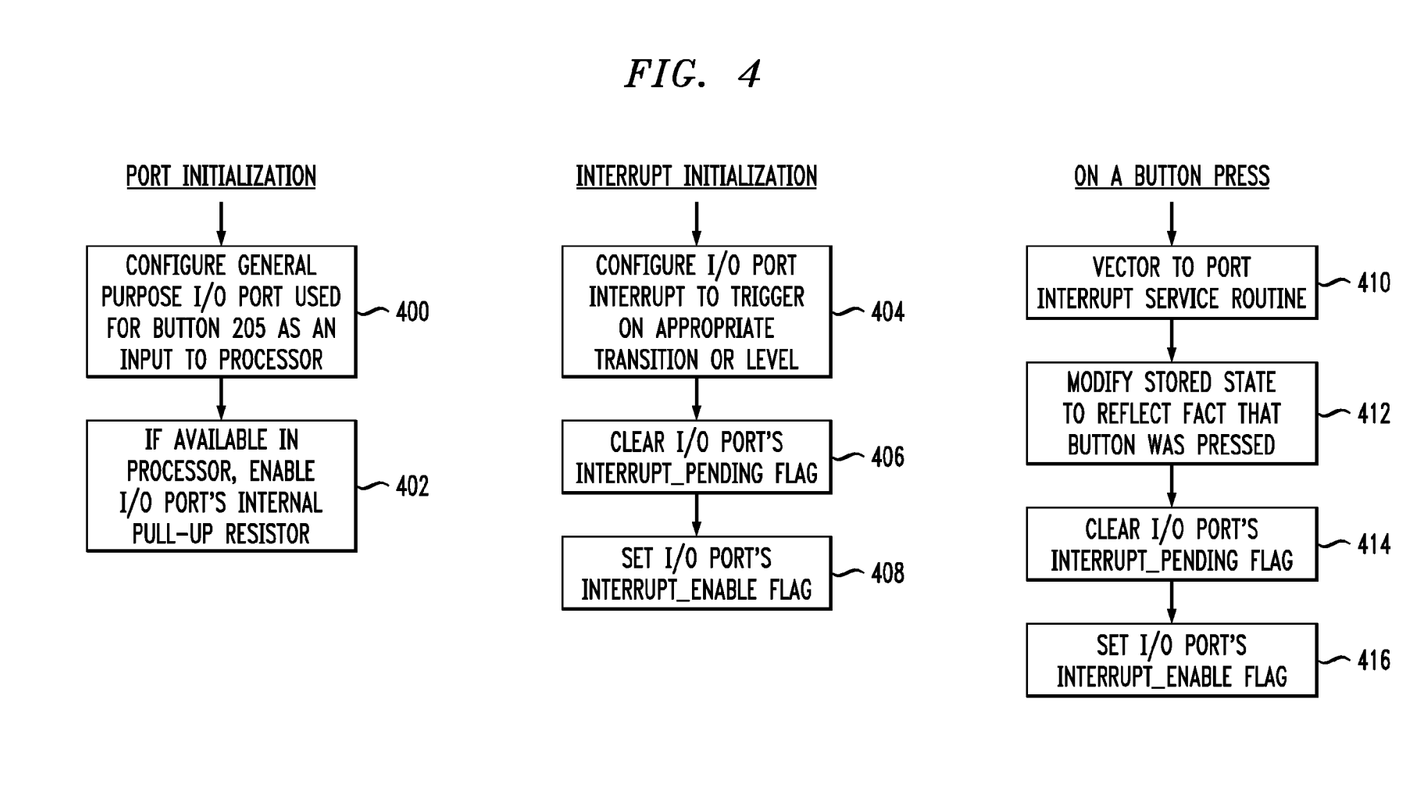
FIGS. 4 and 5 are flow diagrams showing the operation of authentication devices in illustrative embodiments of the invention.
Figure 5:
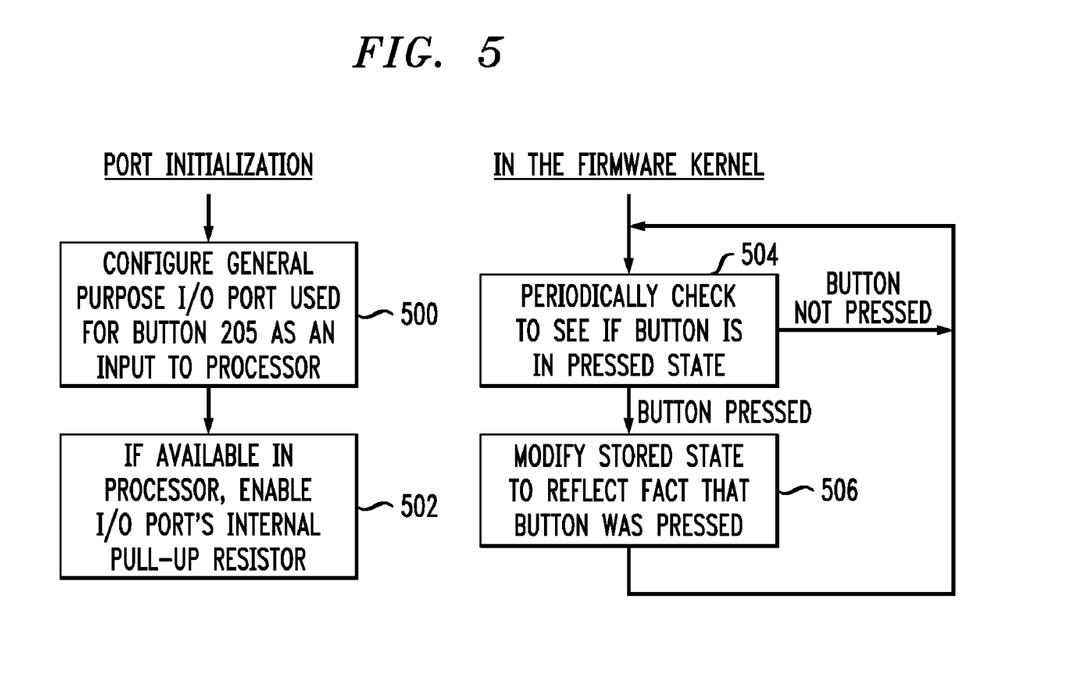

FIGS. 4 and 5 illustrate processing operations implemented in the processor 200 to facilitate current drain mitigation using circuitry 208. These processing operations may be implemented, by way of example, using firmware within internal memory 210 of the processor. For the embodiments shown in FIGS. 4 and 5, it will be assumed that the processor input 300 is a general purpose I/O port of the processor, where the term "port" in this context is intended to be construed broadly so as to encompass, for example, a particular I/O pin of the processor. The FIG. 4 embodiment illustrates a case in which the general purpose I/O port is capable of generating an interrupt to the processor, while the FIG. 5 embodiment illustrates a case in which the general purpose I/O port is not capable of generating an interrupt to the processor.

Referring now to FIG. 4, in a port initialization phase of the process, the general purpose I/O port is configured in step 400 for use by the trigger button 205 as an input to the processor. If an internal pull-up resistor is available for the general purpose I/O port, it is enabled in step 402 as part of the port initialization phase.

Examples of commercially-available processors having general purpose I/O ports capable of generating interrupts include the LC877016A and LC877032F microprocessors from Sanyo Electric Co.

In an interrupt initialization phase, the general purpose I/O port interrupt is configured to trigger on an appropriate transition or level as indicated in step 404. For example, in the case of the current drain mitigation circuitry 208 as shown in FIG. 3A, the port interrupt may be configured to trigger on a high-to-low transition or a low level. The particular triggering configuration will generally vary depending on the particular type of processor being used. The interrupt in this embodiment is triggered upon the trigger 205 transitioning from the unpressed state to the pressed state. The processor then clears an interrupt_pending flag for the general purpose I/O port and sets an interrupt_enable flag for the general purpose I/O port, as indicated in respective steps 406 and 408.

When the button 205 is pressed, the processor 200 responsive to the interrupt initiates a port interrupt service routine in step 410 and modifies stored state information in step 412 to indicate that the button was pressed. For example, a button_pressed state bit stored in one of the registers of the register file 216 may be modified to indicate that the button was pressed. After modifying the stored state information, the processor clears the interrupt_pending flag of the general purpose I/O port in step 414 and sets the interrupt_enable flag of the general purpose I/O port in step 416.

Thus, when the button 205 is pressed, the processor receives the interrupt, processes the corresponding button press and then re-enables the interrupt.

As indicated above, the FIG. 5 embodiment illustrates a case in which the general purpose I/O port is not capable of generating an interrupt to the processor. For this case, the port initialization process is generally the same, comprising steps 500 and 502 which correspond to respective steps 400 and 402 of the FIG. 4 embodiment. However, a kernel or other portion of the firmware in the FIG. 5 embodiment is configured to periodically check to determine if the trigger button 205 is in the pressed state, as indicated in step 504. If the external button is in the pressed state, the firmware kernel modifies stored state information to indicate that the trigger button was pressed, as indicated in step 506. In any case, the process returns to step 504 for a subsequent check for a button press.

The illustrative embodiments described above advantageously reduce the susceptibility of authentication tokens to current drain from external buttons inadvertently stuck in a pressed state, thereby conserving battery power.

It should again be emphasized that the above-described embodiments of the invention are presented for purposes of illustration. Many variations and other alternative embodiments may be used. For example, although described in the context of event-based and time-based authentication tokens, the techniques are applicable to a wide variety of other types of devices that are susceptible to buttons being stuck in a pressed state. Also, the particular configuration of system and device elements shown in FIGS. 1, 2 and 3A-3C, and the process operations shown in FIGS. 4 and 5, may be varied in other embodiments. For example, the particular types of port and interrupt initializations used, and the manner in which button presses are processed, may be varied in alternative current drain mitigation processes. Moreover, the various simplifying assumptions made above in the course of describing the illustrative embodiments should also be viewed as exemplary rather than as requirements or limitations of the invention. Numerous other alternative embodiments within the scope of the appended claims will be readily apparent to those skilled in the art.

What is claimed is:

1. A device comprising:
   a processor;
   an external button alternately configurable in an unpressed state and a pressed state; and
   current drain mitigation circuitry coupled to the external button and a corresponding input of the processor;
   wherein the current drain mitigation circuitry is configured to connect the input of the processor to a first potential when the external button is in the unpressed state and to connect the input of the processor to a second potential different than the first potential when the external button is in the pressed state, thereby limiting current drain arising from the external button being stuck in the pressed state; and
   wherein the current drain mitigation circuitry comprises a capacitive element coupled between the input of the processor and a third potential, the capacitive element being connected between the first potential and the third potential when the external button is in the unpressed state and the capacitive element being connected between the second potential and the third potential when the external button is in the pressed state.

2. The device of claim 1 wherein the current drain mitigation circuitry comprises a switch and a resistor, the switch being configured to connect the input of the processor to a supply voltage via the resistor when the external button is in the unpressed state, and to connect the input of the processor to the third potential when the external button is in the pressed state.

3. The device of claim 1 wherein the input of the processor comprises a general purpose input/output port of the processor.

4. The device of claim 3 wherein an internal pull-up resistor associated with the general purpose input/output port of the processor is enabled as part of a port initialization.

5. The device of claim 3 wherein the general purpose input/output port of the processor is capable of generating an interrupt to the processor.

6. The device of claim 5 wherein the general purpose input/output port of the processor is configured such that the interrupt is generated when the external button transitions from the unpressed state to the pressed state.

7. The device of claim 1 wherein the current drain mitigation circuitry causes an interrupt to the processor to be generated upon the external button transitioning from the unpressed state to the pressed state.

8. The device of claim 7 wherein the processor responsive to the interrupt initiates an interrupt service routine and modifies stored state information to indicate that the external button was pressed.

9. The device of claim 8 wherein after modifying the stored state information the processor clears a corresponding interrupt pending flag and sets a corresponding interrupt enable flag.

10. The device of claim 3 wherein the general purpose input/output port of the processor is not capable of generating an interrupt to the processor.

11. The device of claim 10 wherein the processor periodically checks to determine if the external button is in the pressed state, and if the external button is in the pressed state modifies stored state information to indicate that the external button was pressed.

12. The device of claim 1 wherein the device comprises a low-power hand-held device.

13. The device of claim 1 wherein the device comprises an authentication token.

14. The device of claim 13 wherein the external button comprises a trigger button of a time-based or event-based authentication token.

15. A method for use in a device comprising a processor, an external button alternately configurable in an unpressed state and a pressed state, and current drain mitigation circuitry coupled to the external button and a corresponding input of the processor, the method comprising the steps of:
   configuring the current drain mitigation circuitry to connect the input of the processor to a first potential when the external button is in the unpressed state; and
   configuring the current drain mitigation circuitry to connect the input of the processor to a second potential different than the first potential when the external button is in the pressed state, thereby limiting current drain arising from the external button being stuck in the pressed state;
   wherein the current drain mitigation circuitry comprises a capacitive element coupled between the input of the processor and a third potential, the capacitive element being connected between the first potential and the third potential when the external button is in the unpressed state and the capacitive element being connected between the second potential and the third potential when the external button is in the pressed state.

16. The method of claim 15 wherein the current drain mitigation circuitry comprises a switch and a resistor, the switch being configured to connect the input of the processor to a supply voltage via the resistor when the external button is in the unpressed state, and to connect the input of the processor to ground potential when the external button is in the pressed state.

17. The method of claim 15 wherein the input of the processor comprises a general purpose input/output port of the processor.

18. The method of claim 15 wherein the current drain mitigation circuitry causes an interrupt to the processor to be generated upon the external button transitioning from the unpressed state to the pressed state.

19. The method of claim 18 wherein responsive to the interrupt an interrupt service routine is initiated and stored state information is modified to indicate that the external button was pressed.

20. An authentication system comprising:
   a plurality of authentication devices;
   at least one host device configured for communication with one or more of the authentication devices; and
   an authentication server configured for communication with the host device;
   wherein at least one of the authentication devices comprises a processor, an external button alternately configurable in an unpressed state and a pressed state, and current drain mitigation circuitry coupled to the external button and a corresponding input of the processor;
   wherein the current drain mitigation circuitry is configured to connect the input of the processor to a first potential when the external button is in the unpressed state and to connect the input of the processor to a second potential different than the first potential when the external button is in the pressed state, thereby limiting current drain arising from the external button being stuck in the pressed state; and wherein the current drain mitigation circuitry comprises a capacitive element coupled between the input of the processor and a third potential, the capacitive element being connected between the first potential and the third potential when the external button is in the unpressed state and the capacitive element being connected between the second potential and the third potential when the external button is in the pressed state.

21. The device of claim 1 wherein the second potential is lower than the first potential.

22. The device of claim 1 wherein the third potential is ground potential.

* * * * *